United States Patent
Elsayed (10) Patent No.: US 10,515,708 B2
(45) Date of Patent: Dec. 24, 2019

(54) APPARATUS FOR SAMPLING ELECTRICAL SIGNALS WITH IMPROVED HOLD TIME AND ASSOCIATED METHODS

(71) Applicant: Silicon Laboratories Inc., Austin, TX (US)

(72) Inventor: Mohamed M. Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/676,731

(22) Filed: Aug. 14, 2017

(65) Prior Publication Data

US 2019/0051367 A1 Feb. 14, 2019

(51) Int. Cl.
*G11C 27/02* (2006.01)
*H03K 17/16* (2006.01)

(52) U.S. Cl.
CPC ......... *G11C 27/024* (2013.01); *H03K 17/161* (2013.01)

(58) Field of Classification Search
CPC combination set(s) only.
See application file for complete search history.

(56) References Cited

U.S. PATENT DOCUMENTS

| | | | |
|---|---|---|---|
| 5,422,583 A * | 6/1995 | Blake | G11C 27/024 327/124 |
| 5,945,872 A | 8/1999 | Robertson | |
| 6,265,911 B1 | 7/2001 | Nairn | |
| 6,329,848 B1 | 12/2001 | Maes | |
| 6,504,406 B1 | 1/2003 | Kakitani | |
| 6,577,168 B1 | 6/2003 | Kakitani | |
| 7,298,010 B1 | 11/2007 | Ma | |
| 7,532,042 B2 | 5/2009 | Lee | |
| 7,636,075 B2 * | 12/2009 | Shin | G11C 27/028 327/91 |
| 7,812,646 B2 * | 10/2010 | Augustyniak | G11C 27/026 327/91 |
| 8,115,518 B1 * | 2/2012 | Ali | G11C 27/02 327/390 |
| 8,415,985 B2 | 4/2013 | Cheeranthodi | |
| 8,723,556 B2 | 5/2014 | Thomas | |
| 8,766,670 B2 | 7/2014 | Chen | |
| 2002/0167343 A1 | 11/2002 | Erhart et al. | |
| 2016/0104543 A1 | 4/2016 | Powell | |

OTHER PUBLICATIONS

U.S. Appl. No. 15/676,743, filed Aug. 2017, Elsayed.
U.S. Appl. No. 15/676,757, filed Aug. 2017, Elsayed.
Analog Devices, "Sample-and-Hold Amplifiers, Introduction and Historical Perspective," 2009, 21 pgs.
Kim et al., "Sample & Hold Circuits," 2011, 22 pgs.

(Continued)

*Primary Examiner* — An T Luu
(74) *Attorney, Agent, or Firm* — Law Offices of Maximilian R. Peterson (57) ABSTRACT

An apparatus includes a sample-and-hold (S/H) circuit. The S/H circuit includes a first switch to provide an input signal that is to be sampled, and a second switch coupled to receive the sampled signal. The second switch is further coupled to a capacitor. The S/H circuit further includes at least one native transistor coupled to the second switch and to the capacitor.

20 Claims, 8 Drawing Sheets

(56) References Cited

OTHER PUBLICATIONS

Balaz, "Versatile Sample & Hold Circuit for Industrial and T&M Applications," 2013, 24 pgs.
Intersil Application Note AN517.0, "Applications of Monolithic Sample-and-Hold Amplifiers," 2005, 5 pgs.
Office communication in U.S. Appl. No. 15/676,743, dated May 16, 2018.
Office communication in U.S. Appl. No. 15/676,743, dated Sep. 27, 2018.
Office communication in U.S. Appl. No. 15/676,743, dated Dec. 14, 2018.
Office communication in U.S. Appl. No. 15/676,757, dated Jul. 23, 2018.
Office communication in U.S. Appl. No. 15/676,757, dated Oct. 29, 2018.
Office communication in U.S. Appl. No. 15/676,743, dated Apr. 3, 2019.
Office communication in U.S. Appl. No. 15/676,757, dated Apr. 29, 2019.

\* cited by examiner

Fig. 1

Prior Art

| Voltage drift (mV) | Single-Capacitor | Two-Capacitor | Ratio |
|---|---|---|---|
| 0.1 | 1.03 | 0.88 | 1.2 |
| 1.0 | 10.29 | 1.78 | 5.8 |
| 2.0 | 20.58 | 2.18 | 9.4 |
| 3.0 | 30.87 | 2.47 | 12.5 |
| 5.0 | 51.45 | 2.75 | 17.8 |
| 10.0 | 102.9 | 3.25 | 31.7 |
| 50.0 | 516.0 | 4.94 | 104 |

# APPARATUS FOR SAMPLING ELECTRICAL SIGNALS WITH IMPROVED HOLD TIME AND ASSOCIATED METHODS

CROSS-REFERENCE TO RELATED APPLICATIONS

This application is related to, and incorporates by reference in their entireties for all purposes, the following concurrently filed applications: (a) U.S. patent application Ser. No. 15/676,743, titled "Apparatus for Sampling Electrical Signals with Reduced Leakage Current and Associated Methods," and (b) U.S. patent application Ser. No. 15/676,757, titled "Reduced-Leakage Apparatus for Sampling Electrical Signals and Associated Methods".

TECHNICAL FIELD

The disclosure relates generally to signal sampling circuitry and, more particularly, to apparatus for sample-and-hold (S/H) circuitry, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

In some situations, a circuit may use the value of an analog signal. Sometimes a S/H circuit is used to sample the level of the analog signal. The S/H circuit holds the sampled value until it is used by the circuit.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a S/H circuit. The S/H circuit includes a first switch to provide an input signal that is to be sampled signal, and a second switch coupled to receive the sampled signal. The second switch is further coupled to a capacitor. The S/H circuit further includes at least one native transistor coupled to the second switch and to the capacitor.

According to another exemplary embodiment, an apparatus includes a S/H circuit. The S/H circuit includes a first switch that provides an input signal that is to be sampled, and a second switch coupled to receive the sampled signal. The second switch is further coupled to an output node of the S/H circuit. The S/H circuit further includes one native transistor coupled to the second switch and to the output node of the S/H circuit, and another native transistor coupled to the second switch and to the output node of the S/H circuit.

According to another exemplary embodiment, a method of using a sample and hold (S/H) circuit, having a sample mode and a hold mode, includes providing, by using a first switch, an input signal to be sampled, and using a second switch to provide the input signal to a capacitor. The method further includes using a first native transistor coupled to the second switch to increase a hold time of the S/H circuit.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to S/H circuits. More specifically, the disclosed concepts provide apparatus and methods for S/H circuits with improved performance.

Figure 1:
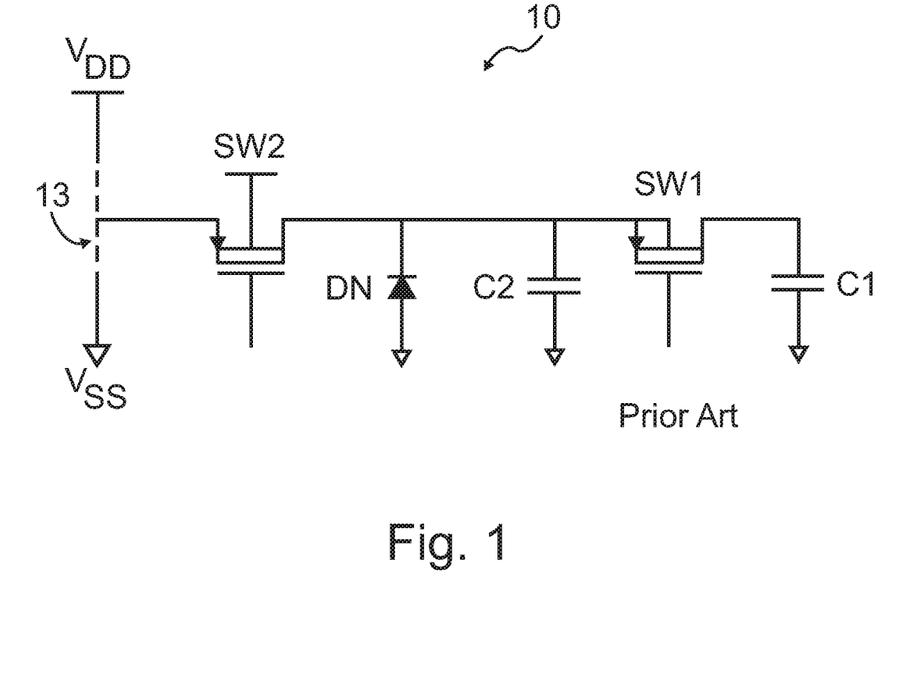
FIG. 1 shows a conventional S/H circuit.

FIG. 1 shows a conventional S/H circuit 10. S/H circuit 10 includes input circuit 13. Input circuit 13 may include one or more switches, current source, and the like, in order to sample the input voltage (not shown), as persons of ordinary skill in the art understand. By virtue of the operation of input circuit 13, the source of transistor SW2 may be coupled to the supply voltage ($V_{DD}$), the input voltage (to be sampled), or the ground voltage ($V_{SS}$), as persons of ordinary skill in the art understand.

As shown, S/H circuit 10 uses output capacitor, C1, and a sampling switch, SW1. In order to reduce the leakage current through SW1, another capacitor, C2, and another switch, SW2, are employed such that the voltage across SW1 is zero. As a consequence, the current though SW1 is zero or nearly zero, and the output node (the top plate of capacitor C1), will leak relatively small current, which allows the circuit to hold the sampled voltage.

The hold time of the output voltage of S/H circuit 10 is limited by the hold time of the intermediate capacitor, C2. The intermediate capacitor is subject to various types of leakage currents, which result in the decay of the output voltage and, thus, limit the hold time of the circuit.

Figure 2:
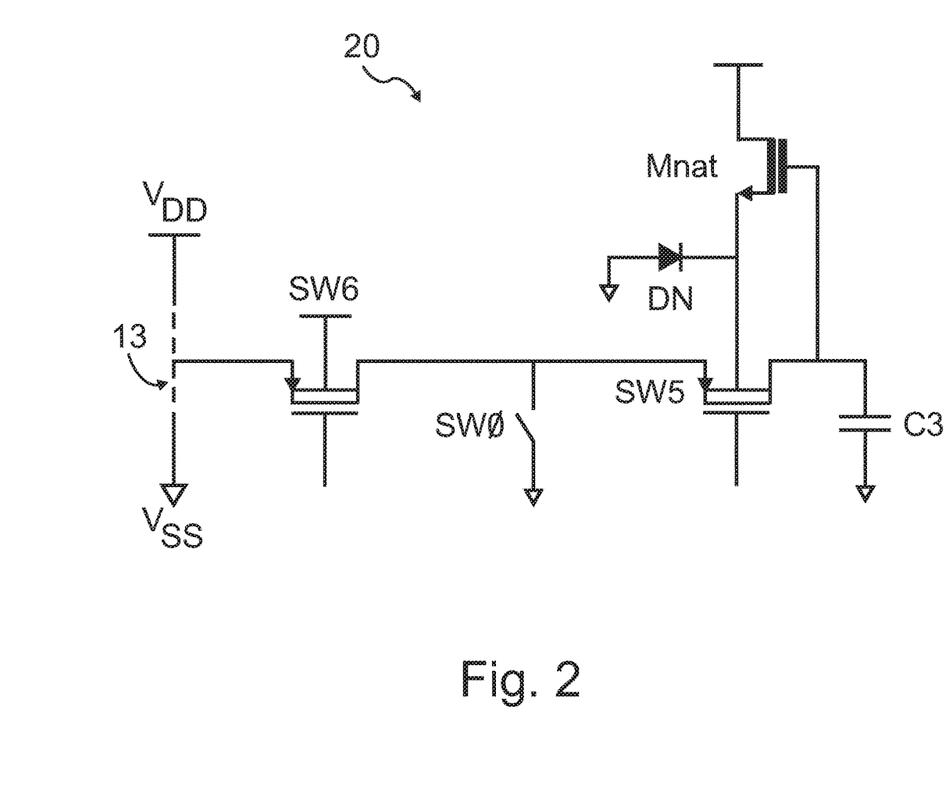
FIG. 2 shows a circuit arrangement for a S/H circuit according to an exemplary embodiment.

FIG. 2 shows a circuit arrangement for a S/H circuit 20 according to an exemplary embodiment. Note that, rather than using two capacitors, S/H circuit 20 uses a single capacitor, C3, with switch SW5 and switch SW6 (which may be omitted under some circumstances, as described below). In exemplary embodiments, capacitor C3 has a capacitance that is the sum of the capacitance of capacitor C1 and the capacitance of capacitor C2 (see FIG. 1).

Referring again to FIG. 2, S/H circuit 20 has an improved (longer) hold time. The improved hold time of S/H circuit 20 can improve various figures of merit of a circuit (or block or subsystem or system or IC) that includes S/H circuit 20.

The improved hold time allows less frequent sampling of the input voltage (not shown). Thus, a host or controller that interfaces with S/H may use fewer clock cycles to sample the output voltage of S/H circuit 20, i.e., the voltage across capacitor C3, because the interval between reading the output voltage may be increased.

The improved hold time allows reduction of the power consumption of the circuit that includes S/H circuit 20 during a low-power (or sleep or hibernate or shutdown or power-down) mode of operation. More specifically, because S/H circuit 20 can maintain or hold the output voltage for a longer period, the circuit, or parts of the circuit, that includes S/H circuit 20 may be placed in a low-power mode for a longer period of time.

For instance, input circuit 13, which provides the voltage to be sampled to the S/H circuit, may be placed in a low-power mode (or sleep or hibernate or shutdown or power-down) after the sampling operation has taken place. In this case, the power consumption is eliminated almost entirely (except for non-ideal effects, such as leakage currents in various transistors in a practical implementation) because input circuit 13 is turned off, while the output voltage, which is stored on capacitor C3, is still available for use by other circuits (e.g., other circuits within or external to an IC that includes S/H circuit 20).

Referring again to the exemplary embodiment shown in FIG. 2, switch SW6, implemented using a metal oxide semiconductor field effect transistor (MOSFET) in the embodiment shown, is coupled to input circuit 13. Specifically, the source of SW6 is coupled to input circuit 13, while the bulk of switch SW6 is coupled to the supply voltage. During the sample mode, the gate of switch SW6 is coupled to ground potential, while during the hold mode, the gate of switch SW6 is coupled to the supply voltage.

The drain of SW6 is coupled to switch SW0 and to switch SW5. In the embodiment shown, switch SW5 is implemented as a MOSFET, whose source is coupled to switch SW0 and to the drain of switch SW6. Switch SW6 isolates or uncouples input circuit 13 from switch SW5 in the hold mode of operation.

Switch SW5 and switch SW6 selectively provide the input voltage (the voltage to be sampled) to capacitor C3 in order to sample the input voltage. During the sample mode of operation, i.e., when S/H circuit 20 samples the input voltage, switch SW0 is open, and switch SW6 is on and provides the input voltage (the voltage to be sampled) to switch SW5, which provides the voltage to capacitor C3. Conversely, during the hold mode of operation, i.e., when S/H circuit 20 holds the sampled voltage and provides it as the output voltage across capacitor C3, switch SW0 is closed. Note that closing switch SW0 pulls the drain of transistor SW6 and the source of transistor SW5 down to the ground voltage as shown or, generally in other embodiments, to a voltage lower than the held voltage.

In some embodiments, switch SW0 is controlled via a controller (not shown). By applying a control signal, the controller may cause switch SW0 to be opened or closed, depending on whether S/H circuit 20 is sampling or holding. In exemplary embodiments, the controller also controls switch SW5 and switch SW6.

In various embodiments, the controller may be implemented in a variety of ways, as persons of ordinary skill in the art will understand. Without limitation, examples include finite state machines, general logic controllers or circuits, and the like, as desired, and as persons of ordinary skill in the art will understand.

In some embodiments, the controller may be a host. The host may take a variety of forms and include a variety of circuitry, as persons of ordinary skill in the art will understand. Without limitation, the host may be a processor, MCU, and the like, as persons of ordinary skill in the art will understand.

The host may communicate with or interface with switch SW0. By applying a control signal, the host may cause switch SW0 to be opened or closed, depending on whether S/H circuit 20 is sampling or holding.

In some embodiments, a control signal may be applied directly to switch SW0, without using a controller or host. In this situation, the user of S/H circuit 20 or a circuit under the control of the user or other source, may apply a control signal to cause switch SW0 to open or close, as described above. Similar arrangements may be used for switches SW5 and SW6.

Switch SW0, and generally other switches in S/H circuit 20, may be implemented in a variety of ways, as persons of ordinary skill in the art will understand. Without limitation, the switches may be implemented using MOSFETs, as desired. In the example shown in FIG. 2, switches SW5 and SW6 are realized using p-channel MOSFETs.

During the sample mode, the gates of transistor SW5 and transistor SW6 are coupled to circuit ground. As a result, the input voltage (the voltage to be sampled, provided by input circuit 13) is coupled across capacitor C3, and is therefore sampled. Sampling of the input voltage takes place when transistor SW5 turns off (its gate voltage is raised from ground voltage to a voltage higher than the sampled voltage, such as the supply voltage). During the hold mode, the gate of transistor SW5 is coupled to the supply voltage (which causes transistor SW5 to turn off), while its drain is coupled to capacitor C3. The bulk of transistor SW5 is coupled to diode DN and to the source of native transistor Mnat. The drain of transistor Mnat is coupled to the supply voltage, and its gate is coupled to the drain of transistor SW5 and capacitor C3. The gate of transistor SW6 is also coupled to the supply voltage, which turns off transistor SW6.

Diode DN is a parasitic diode, present when S/H circuit is implemented in an IC. More specifically, diode DN represents the junction between the n-well that includes switch SW5 and the p-type substrate when S/H circuit 20 is realized as part of an IC, such as a complementary metal oxide semiconductor (CMOS) IC. As noted, transistor Mnat is a native transistor. Native transistors, such as the n-channel transistor shown, have negative threshold voltages, as persons of ordinary skill in the art understand.

Note that in S/H circuit 20, the bulk or body of transistor SW5 is not coupled to its source. Instead, diode DN is coupled to the bulk, while the source is coupled to switches SW0 and SW6, as discussed above. This scheme is used to increase the hold time of S/H circuit 20, as described below in detail.

Note further that two current leakage paths exist for the output node (the top plate of capacitor C3 or the drain of transistor SW5). One leakage path is from the output node to the source of transistor SW5 or from the output node to the bulk of transistor SW5. S/H circuit 20 includes features to reduce or eliminate (or nearly eliminate in a practical implementation) the leakage current. Furthermore, the gate leakage of transistor Mnat and the drain-gate leakage current of switch SW5 are negligible (relative to other currents in the circuit).

To eliminate or reduce the leakage current from the output node to the source of transistor SW5, the source voltage is pulled to the ground voltage. In that case, transistor SW5 is off, but has a relatively large gate-source voltage ($V_{DD}$). The relatively large gate-source voltage is sufficient to reduce or eliminate leakage current from the output node to the source of transistor SW5.

In order to reduce or eliminate the leakage current between the output node and the bulk of transistor SW5, the bulk voltage is driven by native transistor Mnat. The gate of transistor Mnat is tied to the output node, as a result of which the gate voltage tracks the output voltage of S/H circuit 20.

When native transistor Mnat conducts zero current (or nearly zero current, in a practical implementation), its source voltage is higher than its gate voltage by one threshold voltage. In some embodiments, the threshold voltage of transistor Mnat is on the order of about 1 volt.

Note that the current in native transistor Mnat includes the leakage current through diode DN (e.g., on the order of tens of picoamps in an exemplary embodiment). Note further that the leakage current in diode DN is not supplied from the output node or from the charge stored on a capacitor such as capacitor C3. Instead, the leakage current of diode DN is provided from the supply voltage ($V_{DD}$), which is the drain voltage of native transistor Mnat. As a result, the effect of the leakage current of diode DN on the hold time of S/H circuit 20 is reduced or eliminated.

A second source of leakage current is transistor SW5 itself, specifically through its bulk to drain diode (not shown, but inherent to MOSFETs). That leakage current has two components: a reverse-biased diode leakage-current component, and a gate-induced drain leakage (GIDL) current component.

With respect to the reverse-biased diode leakage-current component, limiting the voltage across the drain-bulk diode to one threshold voltage of native transistor Mnat reduces or eliminates (or nearly eliminates, in a practical implementation) the leakage current. The drain-bulk junction of transistor SW5 is always reverse-biased, and the drain-bulk voltage is constant and independent of the absolute value of the output voltage of S/H circuit 20, and independent of the drift of the voltage at the output node. Consequently, the leakage current is constant and, as a result, the drop in the output voltage of S/H circuit 20 is linear over time.

Note that input circuit 13 may be included in S/H circuit 20, as shown in the exemplary embodiments in FIG. 2, or it may be omitted from S/H circuit 20, and an external input circuit may be used. Broadly speaking, input circuit 13 is the circuit that generates the voltage to be sampled, or makes that voltage available to the S/H circuit. Once the voltage is sampled, the output of input circuit 13 may have any arbitrary value, such as ground voltage, supply voltage, or a voltage in between those voltages.

In some embodiments, in order to keep transistor SW5 off, switch SW0 may be used to pull the source of transistor SW5 to ground during the hold mode or, alternatively, a pull-down resistor may be used. Note further that, depending on the details of implementation of input circuit 13, in some embodiments switch SW6 may be omitted from S/H circuit 20. More specifically, if the output of input circuit 13 is at ground potential during the hold mode, then switch SW6 and switch SW0 may be eliminated.

Figure 3:
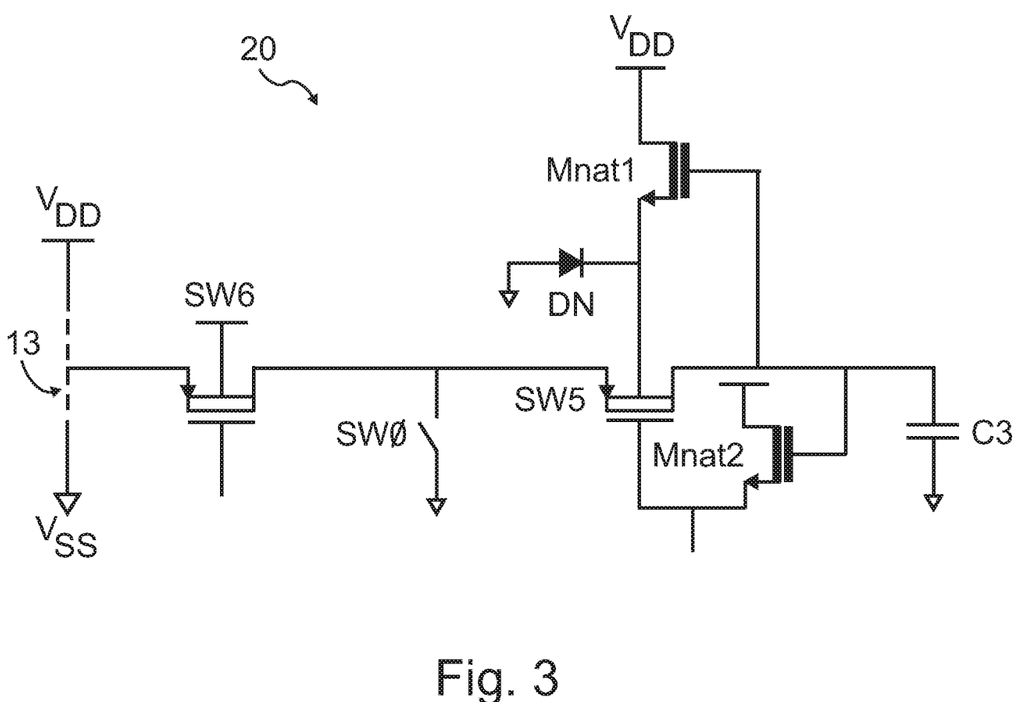
FIG. 3 shows a circuit arrangement for a S/H circuit according to another exemplary embodiment.

With respect to the GIDL-current component, the embodiment in FIG. 3 may be used to eliminate (or nearly eliminate, in a practical implementation) or reduce that current. The circuit in FIG. 3 is similar to the circuit in FIG. 2 and operates similarly. Thus, S/H circuit 20 in FIG. 3 reduces or eliminates (or nearly eliminates, in a practical implementation) the leakage currents described above, such as the reverse-biased diode leakage current.

In order to address the GIDL-current component, S/H circuit 20 in FIG. 3 uses two native transistors. The first native transistor, Mnat1, is similar to native transistor Mnat in FIG. 2, and is coupled similarly. Referring again to FIG. 3, a second native transistor Mnat2 is also used to address the GIDL-current component.

More specifically, transistor Mnat2 has its gate coupled to the output node, i.e., to the gate of transistor Mnat1, the top plate of capacitor C3, and to the drain of transistor SW5. The drain of n-channel transistor Mnat2 is coupled to the supply voltage. The source of transistor Mnat2 drives the gate of transistor SW5. As a result, the gate voltage of transistor SW5 is limited to one threshold voltage (the threshold voltage of transistor Mnat2) higher than the voltage at the output node. As a result, the leakage because of the GIDL current is reduced or eliminated (or nearly eliminate, in a practical implementation).

Figure 4:
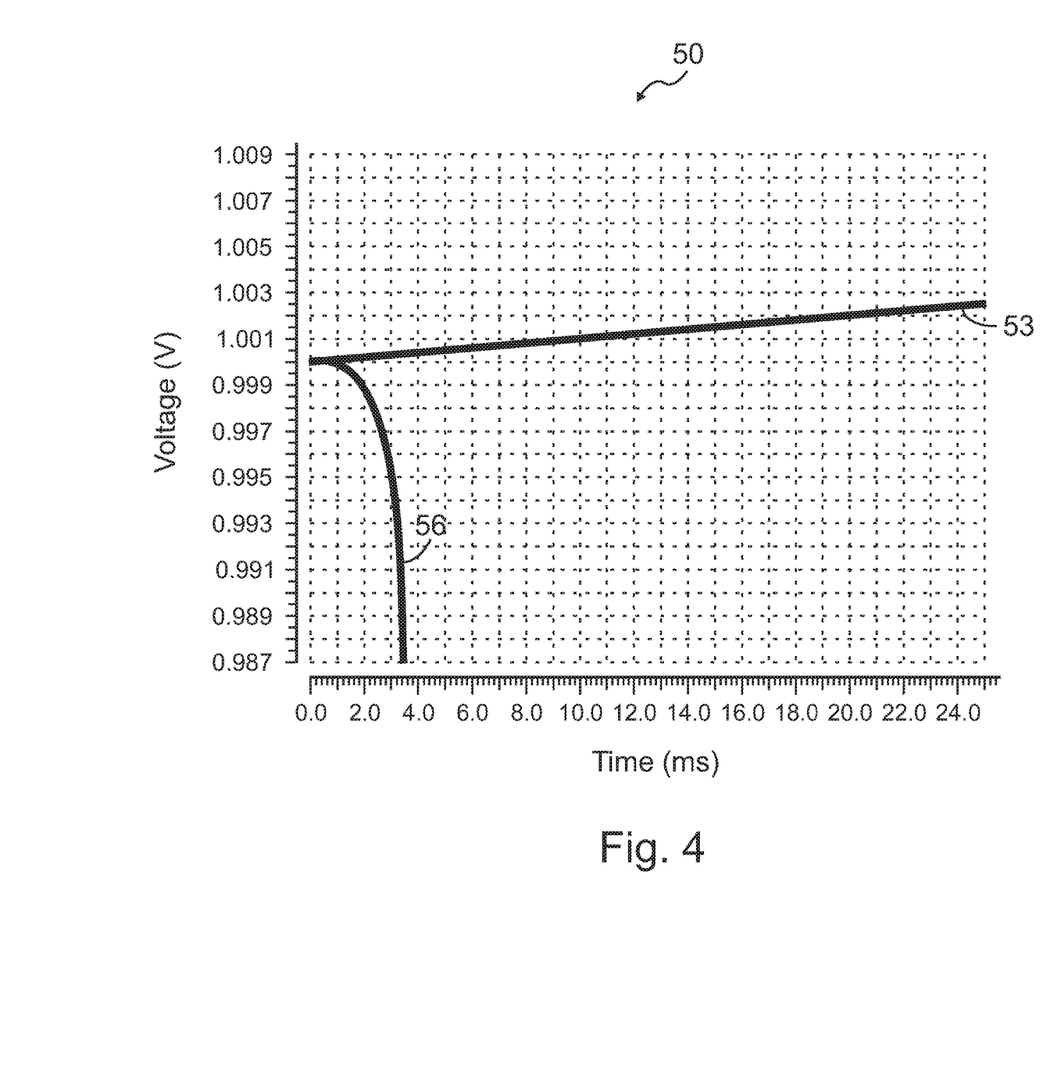
FIG. 4 shows a composite plot to illustrate performance of a S/H circuit according to an exemplary embodiment.

FIG. 4 shows a composite plot 50 to illustrate simulated performance of S/H circuit 20 in FIG. 3. More specifically, plot 53 illustrates the output voltage as a function of time of S/H circuit 20. Plot 56, on the other hand, illustrates the output voltage of S/H circuit 10 (see FIG. 1).

Simulations of the two circuits were performed at fast process corners (where leakage currents increase) and at a temperature of 135° C. The simulations indicate that the leakage current of the output node is nearly constant at about 195 fA for S/H circuit 20. For S/H circuit 10, the leakage current exponentially changes over time. Note that the architecture of S/H circuit 20 may generally be used with any process/temperature corner, as persons of ordinary skill in the art will understand.

FIG. 4 shows the output voltages of the two circuits using a supply voltage of 3.6 volts, an input voltage (sampled signal) of 1 volt, C1 and C2 each having 1 pF of capacitance, while C3 has 2 pF of capacitance. As plot 53 and plot 56 illustrate, S/H circuit 20 has an improved hold time.

Figure 5:
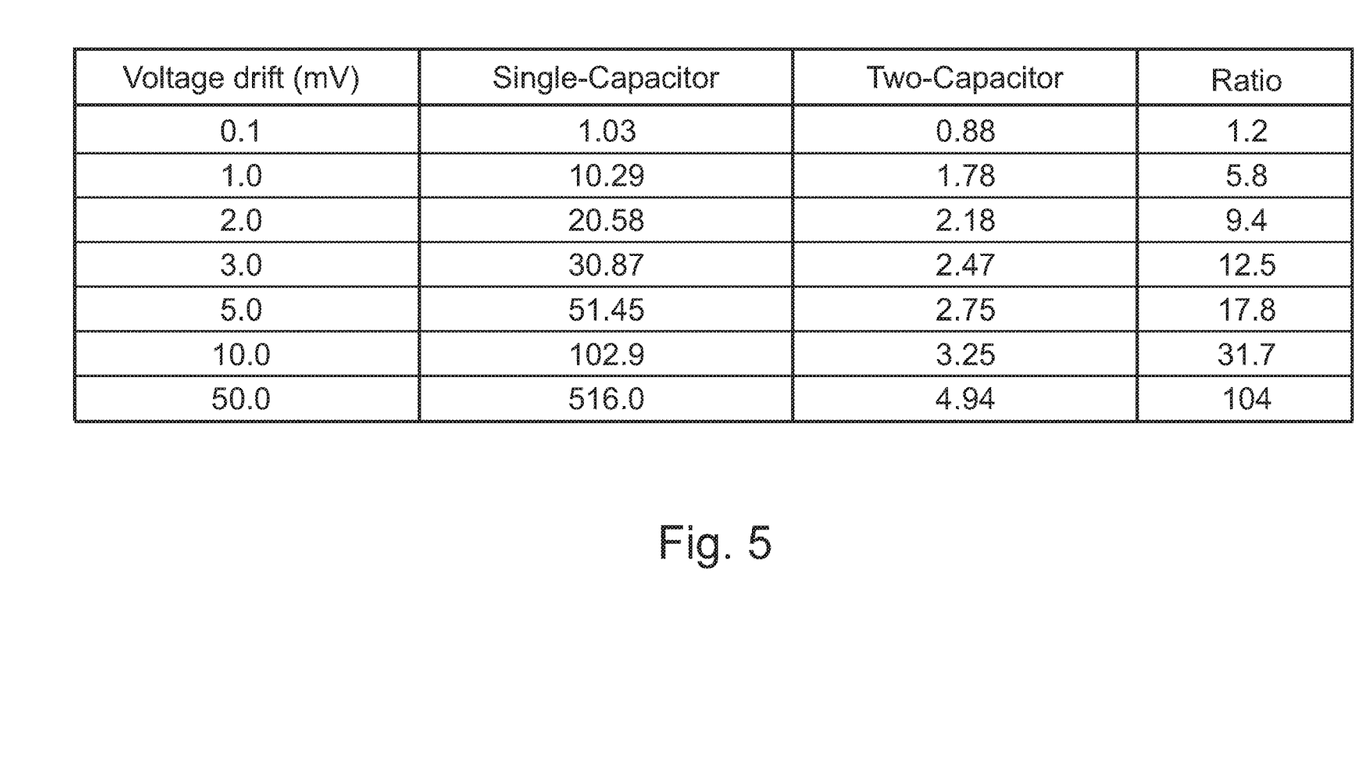
FIG. 5 shows a table that includes data relating to the performance of a S/H circuit according to an exemplary embodiment.

FIG. 5 shows a table that includes data relating to the performance of S/H circuit 20 in FIG. 3. More specifically, the table summarizes the hold time in milliseconds for different voltage drifts for S/H circuit 20 (see FIG. 3) and S/H circuit 10 (see FIG. 1) under the column headings "Single-Capacitor" and "Two-Capacitor," respectively. The column with the heading "Ratio" provides the ratios of the hold times for the single-capacitor S/H circuit to the hold times for the two-capacitor S/H circuit.

Figure 7:
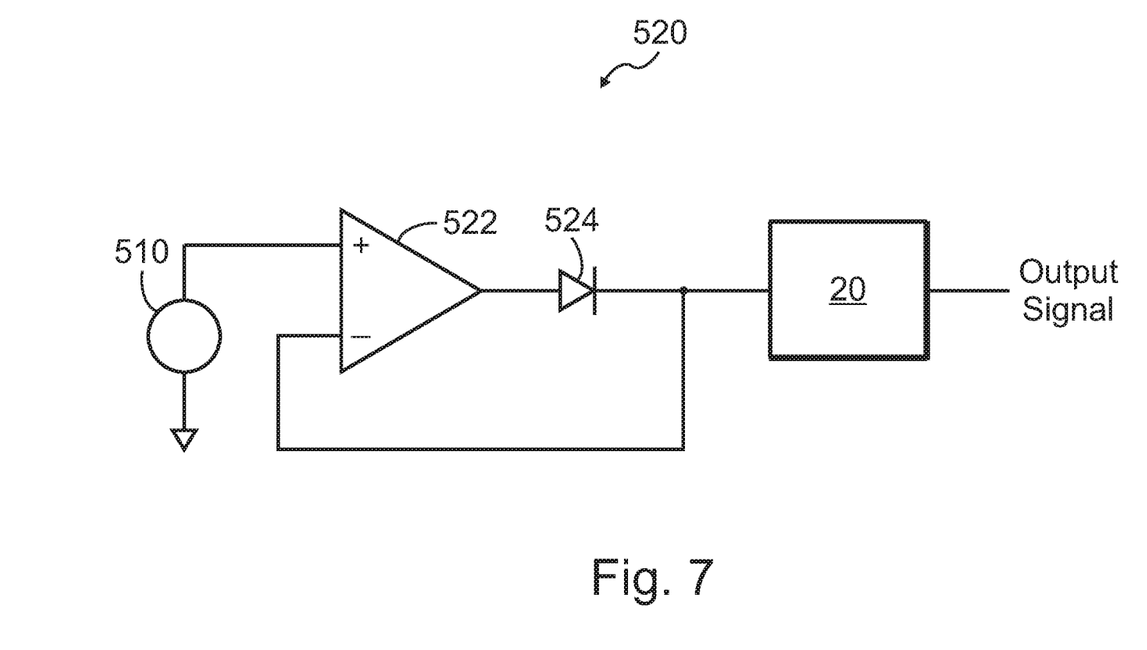
FIG. 7 shows a circuit arrangement for using a S/H circuit according to another exemplary embodiment.
Figure 8:
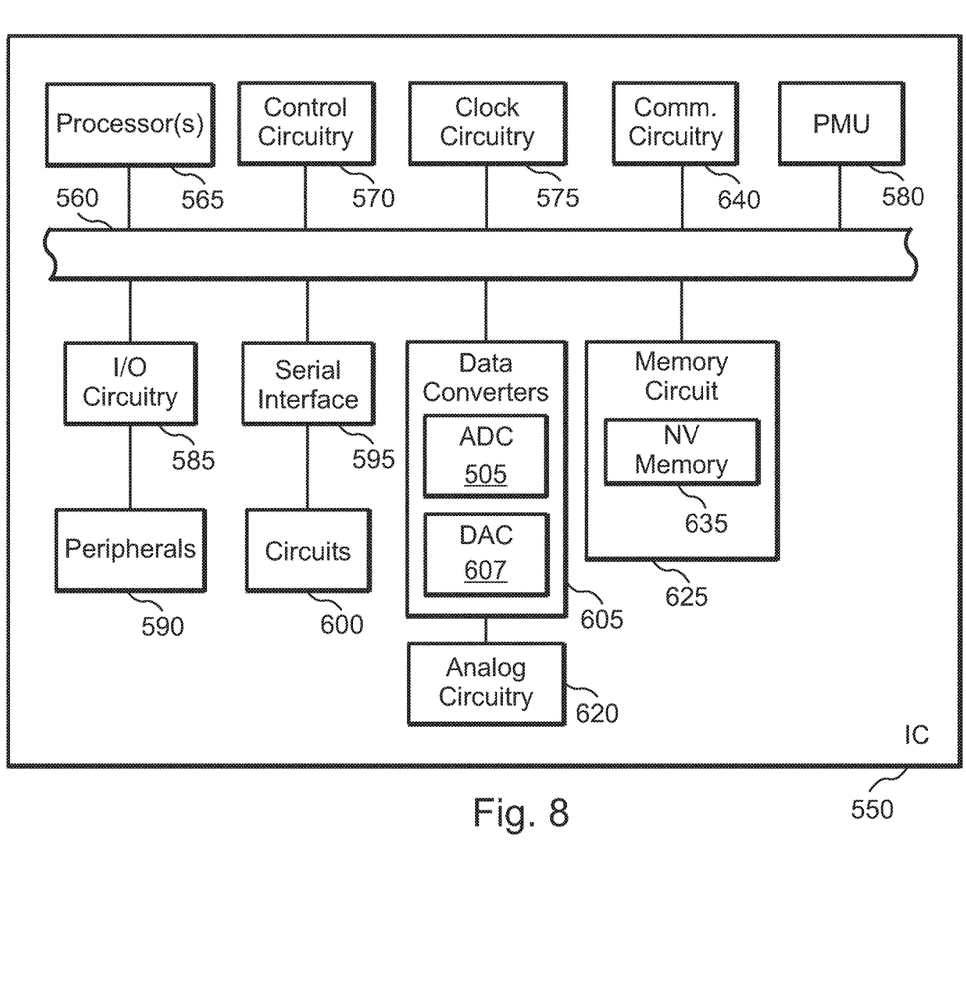
FIG. 8 shows a block diagram of an IC, including a microcontroller unit (MCU), according to an exemplary embodiment.

As noted, S/H circuits according to exemplary embodiments may be used in a variety of circuitry and applications. To illustrate, without limitation, FIGS. 6-8 provide some examples.

Figure 6:
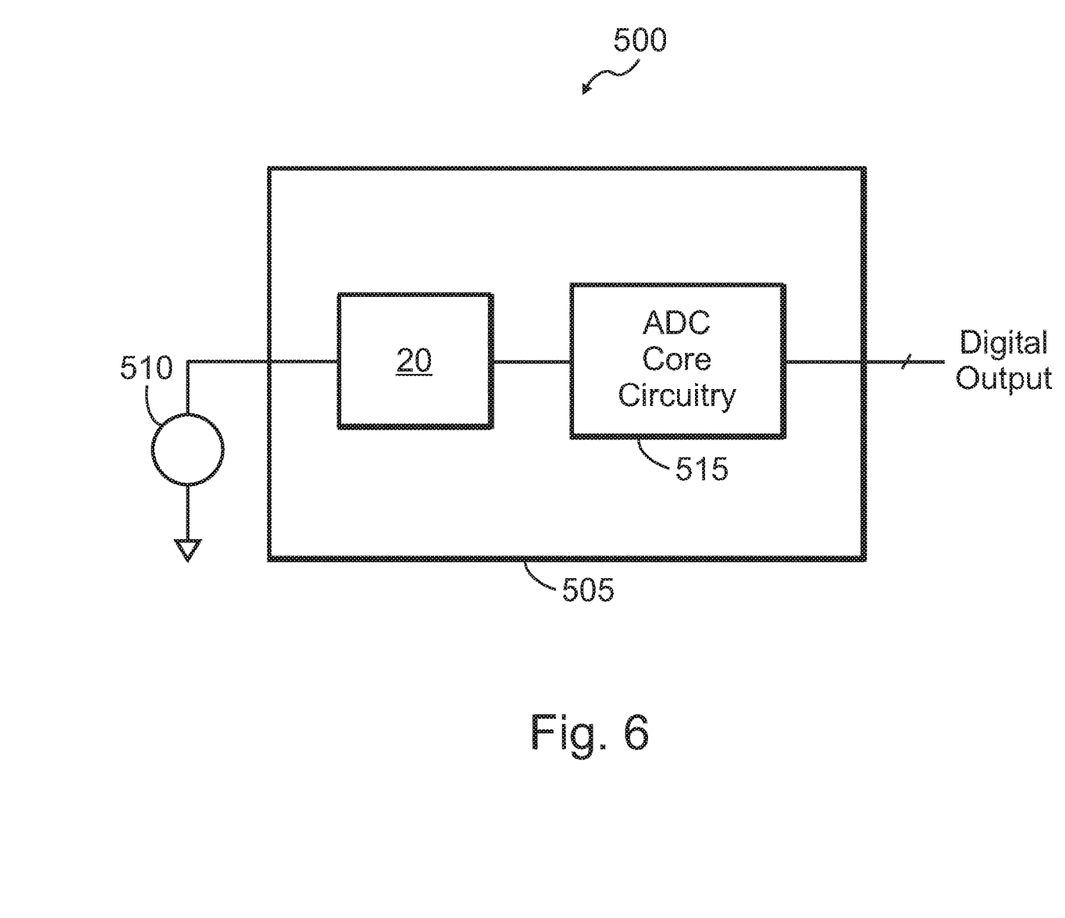
FIG. 6 shows a circuit arrangement for using a S/H circuit according to an exemplary embodiment.

FIG. 6 shows a circuit arrangement 500 for using a S/H circuit 20 according to an exemplary embodiment. More specifically, circuit arrangement 500 shows the use of S/H circuit 20 in an analog-to-digital converter (ADC 505).

ADC 505 converts an analog signal supplied by signal source 510 to a digital output signal. ADC 505 includes S/H circuit 20, and ADC core circuitry 515. S/H circuit 20 samples the signal supplied by signal source 510, and holds the sampled value. At various intervals in time, the sample and hold operation may be repeated, as desired.

In some embodiments, the sample and hold operation may be performed under the control of ADC core circuitry 515 or a controller (not shown) in ADC 505. In some embodiments, the sample and hold operation may be performed under the control of a controller or circuit external to ADC 505.

ADC core circuitry 505 uses the output signal of S/H circuit 20 as the analog signal that it converts to a digital format. ADC core circuitry 505 may use a variety of techniques to perform the analog to digital conversion, as persons of ordinary skill in the art will understand. In some embodiments, ADC core circuitry 505 may use a successive-approximation technique to perform the signal conversion.

FIG. 7 shows a circuit arrangement 520 for using a S/H circuit 20 according to another exemplary embodiment. More specifically, circuit arrangement 520 illustrates a peak detector circuit.

The peak detector circuit detects and holds the peak values of a signal supplied by signal source 510. An amplifier 522 receives the signal supplied by signal source 510 at its non-inverting input. A diode 524 couples the output of amplifier 522 to its inverting input.

Diode 524 also couples the output of amplifier 522 to the input of S/H circuit 20. In other words, S/H circuit 20 receives its input voltage from the output of amplifier 522 through diode 524. In response to a control signal from a controller (not shown), S/H circuit 20 samples the signal provided via diode 524. In response to the control signal (e.g., a change to indicate switching from the sample mode to the hold mode), S/H circuit 20 then holds the sampled signal, and provides the held signal as an output signal of the peak detector.

In some embodiments, one or more S/H circuits 20 may be integrated in an IC that includes an MCU. FIG. 8 shows a circuit arrangement 500 of such an embodiment.

Circuit arrangement 500 includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 505 and/or one or more DACs 607. The ADC(s) 505 receive analog signal(s) from analog circuitry 620, and convert the analog signal(s) to a digital format, which they communicate to one or more blocks coupled to link 560. In some embodiments, one or more of ADCs 505 includes one or more S/H circuits 20, as desired.

Analog circuitry 620 may include a wide variety of circuitry that provides and/or receives analog signals. Examples include sensors, transducers, buffers, amplifiers, comparators, etc., as persons of ordinary skill in the art will understand. In some embodiments, analog circuitry 620 may communicate with circuitry external to IC 550 to form more complex systems, sub-systems, control blocks, and information processing blocks, as desired. In some embodiments, analog circuitry 620 includes one or more S/H circuits 20, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580 to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s)

365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance or configuration of one or more blocks in IC 550.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
    a sample-and-hold (S/H) circuit, comprising:
        a first switch to provide an input signal that is to be sampled;
        a second switch coupled to receive the input signal, the second switch further coupled to a capacitor;
        a third switch coupled to a ground of the S/H circuit and to a node between the first and second switches; and
        a first native transistor coupled to the second switch and to the capacitor.

2. The apparatus according to claim 1, wherein the third switch is closed during a hold mode of the S/H circuit.

3. The apparatus according to claim 1, wherein the third switch is open during a sample mode of the S/H circuit.

4. The apparatus according to claim 1, wherein the first switch comprises a first metal semiconductor field effect transistor (MOSFET), and wherein the second switch comprises a second MOSFET.

5. The apparatus according to claim 4, wherein during a hold mode of the S/H circuit, a gate of the first native transistor is coupled to a drain of the second MOSFET, and wherein a source of the first native transistor is coupled to a bulk of the second MOSFET.

6. The apparatus according to claim 5, further comprising a second native transistor having a source coupled to a gate of the second MOSFET and a gate coupled to the drain of the second MOSFET.

7. The apparatus according to claim 5, wherein a source of the first MOSFET is coupled to receive the input signal, and wherein a drain of the first MOSFET is coupled to a source of the second MOSFET.

8. The apparatus according to claim 1, further comprising an input circuit to accept the input signal and to couple the input signal to the first switch.

9. An apparatus, comprising:
    a sample-and-hold (S/H) circuit, comprising:
        a first switch to provide an input signal that is to be sampled;
        a second switch coupled to receive the input signal, the second switch further coupled to an output node of the S/H circuit;
        a first native transistor coupled to the second switch and to the output node of the S/H circuit; and
        a second native transistor coupled to the second switch and to the output node of the S/H circuit.

10. The apparatus according to claim 9, further comprising a capacitor coupled to the output node of the S/H circuit.

11. The apparatus according to claim 10, wherein the first switch comprises a first metal oxide semiconductor field effect transistor (MOSFET), and wherein the second switch comprises a second MOSFET.

12. The apparatus according to claim 11, wherein a source of the first native transistor is coupled to a bulk of the second MOSFET, a drain of the first native transistor is coupled to a supply voltage, and a gate of the first native transistor is coupled to a drain of the second MOSFET.

13. The apparatus according to claim 11, wherein a source of the second native transistor is coupled to a gate of the second MOSFET, a drain of the second native transistor is coupled to a supply voltage, and a gate of the second native transistor is coupled to a drain of the second MOSFET.

14. A method of using a sample and hold (S/H) circuit having a sample mode and a hold mode, the method comprising:
    providing, by using a first switch, an input signal to be sampled;
    using a second switch to provide the input signal to a capacitor;
    grounding a node between the first and second switches by using a third switch during the hold mode of the S/H circuit; and
    using a first native transistor coupled to the second switch to increase a hold time of the S/H circuit.

15. The method according to claim 14, further comprising opening the third switch during the sample mode of the S/H circuit.

16. The method according to claim 14, wherein using the first native transistor coupled to the second switch to increase the hold time of the S/H circuit further comprises reducing at least one leakage current in the S/H circuit.

17. The method according to claim 14, further comprising using a second native transistor coupled to the second switch to increase the hold time of the S/H circuit.

18. The method according to claim 17, wherein using the second native transistor coupled to the second switch to increase the hold time of the S/H circuit further comprises reducing a gate induced drain leakage current of the second transistor.

19. The method according to claim 14, wherein grounding the node between the first and second switches by using the third switch during the hold mode of the S/H circuit comprises closing the third switch during the hold mode of the S/H circuit.

20. The method according to claim 14, wherein providing, by using the first switch, the input signal to be sampled further comprises using an input circuit to accept the input signal and to couple the input signal to the first switch.

* * * * *